United States Patent
Kim et al.

(10) Patent No.: US 9,940,859 B2
(45) Date of Patent: Apr. 10, 2018

(54) TESTING APPARATUS FOR TESTING DISPLAY APPARATUS AND METHOD OF TESTING THE SAME

(71) Applicant: SAMSUNG DISPLAY CO., LTD., Yongin, Gyeonggi-Do (KR)

(72) Inventors: Dae Won Kim, Hwaseong-si (KR); Hanki Park, Incheon (KR); Chanhyung Yoo, Seoul (KR); Wookjae Lee, Seoul (KR); Inho Hwang, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 181 days.

(21) Appl. No.: 14/795,024

(22) Filed: Jul. 9, 2015

(65) Prior Publication Data

US 2016/0086527 A1   Mar. 24, 2016

(30) Foreign Application Priority Data

Sep. 18, 2014   (KR) .......................... 10-2014-0124267

(51) Int. Cl.
*G01R 31/00*   (2006.01)
*G09G 3/00*   (2006.01)
*G01R 27/26*   (2006.01)
*G01R 1/04*   (2006.01)
*G06F 1/16*   (2006.01)
*G06F 3/041*   (2006.01)

(52) U.S. Cl.
CPC ............ *G09G 3/006* (2013.01); *G01R 1/0408* (2013.01); *G01R 27/2605* (2013.01); *G06F 1/1652* (2013.01); *G06F 3/041* (2013.01); *G06F 2203/04102* (2013.01); *G09G 2380/02* (2013.01)

(58) Field of Classification Search
CPC .............. G01R 27/2605; G01R 1/0408; G01R 31/31924; G01R 31/31922; G01R 31/31937; G01R 31/2887; G01R 31/2886; G01R 31/2851; G09G 3/006; G09G 3/3648; G02F 1/309; G06F 1/1652; G06F 3/041
USPC ......... 324/750.01, 756.01, 760.01, 537, 511; 362/561, 365, 366
See application file for complete search history.

(56) References Cited

U.S. PATENT DOCUMENTS 8,816,714 B2 *   8/2014   Kwon ................... G02F 1/309
                                          324/756.01
9,007,300 B2 *   4/2015   Hirsch .................. G06F 1/1652
                                          345/156
(Continued)

FOREIGN PATENT DOCUMENTS

JP         2014071043        *   4/2014
KR   10-2010-0006957 A          1/2010
(Continued)

*Primary Examiner* — Thang Le
(74) *Attorney, Agent, or Firm* — Lee & Morse, P.C.

(57) ABSTRACT

A testing apparatus for testing a display apparatus includes a base substrate, a plurality of fixing tools on the base substrate to affix the display apparatus to the base substrate, the plurality of fixing tools being movable in a z-axis direction independently of each other, the z-axis direction extending along a normal direction to the base substrate, and a controller that controls the fixing tools to bend the display apparatus in two or more test patterns different from each other.

19 Claims, 9 Drawing Sheets

(56) References Cited

U.S. PATENT DOCUMENTS

| | | | |
|---|---|---|---|
| 9,383,776 B2 * | 7/2016 | Choi | G06F 1/1652 |
| 2012/0067134 A1 * | 3/2012 | Bell | G02F 1/133305 |
| | | | 73/800 |
| 2013/0207946 A1 * | 8/2013 | Kim | G09G 3/3225 |
| | | | 345/204 |
| 2014/0307257 A1 * | 10/2014 | Takagi | G02F 1/1309 |
| | | | 356/244 |
| 2016/0143162 A1 * | 5/2016 | Van Dijk | G06F 1/1652 |
| | | | 361/679.01 |
| 2016/0324017 A1 * | 11/2016 | Cho | H02K 7/00 |

FOREIGN PATENT DOCUMENTS

| | | | |
|---|---|---|---|
| KR | 10-2011-0114256 A | | 10/2011 |
| KR | 10-2012-0010801 A | | 2/2012 |
| KR | 20120010801 | * | 2/2012 |
| KR | 10-1358732 B1 | | 1/2014 |

* cited by examiner

TESTING APPARATUS FOR TESTING DISPLAY APPARATUS AND METHOD OF TESTING THE SAME

CROSS-REFERENCE TO RELATED APPLICATION

Korean Patent Application No. 10-2014-0124267, filed on Sep. 18, 2014, in the Korean Intellectual Property Office, and entitled: "Testing Apparatus Of Testing Display Apparatus and Method Of Testing The Same," is incorporated by reference herein in its entirety.

BACKGROUND

1. Field

The present disclosure relates to a testing apparatus for testing a display apparatus and a method of testing the same. More particularly, the present disclosure relates to a testing apparatus for testing flexibility reliability of a flexible display apparatus and a method of testing the flexible display apparatus using the testing apparatus.

2. Description of the Related Art

In recent years, various display apparatuses, e.g., a liquid crystal display, an organic light emitting diode display, a plasma display panel, an electrophoretic display, etc., are used to display an image. A flexible display apparatus has been actively developed according to great demands in the market. The flexible display apparatus displays an image not only when the flexible display apparatus is curved, but also when the flexible display apparatus is stretched out again after being curved. Accordingly, flexibility that represents a degree to which the flexible display apparatus is curved, while normally displaying an image, is an important property of the flexible display apparatus.

SUMMARY

The present disclosure provides a testing apparatus capable of testing and improving reliability of flexibility of a display apparatus.

The present disclosure also provides a testing method of the display apparatus using the testing apparatus.

Embodiments provide a testing apparatus of testing a display apparatus, including a base substrate, a plurality of fixing tools on the base substrate to affix the display apparatus to the base substrate, the plurality of fixing tools being movable in a z-axis direction independently of each other, the z-axis direction extending along a normal direction to the base substrate, and a controller that controls the fixing tools to bend the display apparatus in two or more test patterns different from each other.

The fixing tools may include first, second, third, and fourth fixing tools, the first, second, third, and fourth fixing tools clamping first, second, third, and fourth corners of the display apparatus, respectively.

The first, second, third, and fourth fixing tools may independently move in an x-axis direction and a y-axis direction, the x-axis direction and the y-axis direction being parallel to the base substrate.

A distance in the x-axis and y-axis directions between the first, second, third, and fourth fixing tools may be controlled according to a size of the display apparatus.

Each of the fixing tools may include a supporting part supporting the display apparatus, a holding part facing the supporting part, such that the display apparatus is between the holding part and the supporting part, the holding part fixing the display apparatus to the supporting part, a first z-axis moving part connected to the supporting part to move the supporting part in the z-axis direction, and a second z-axis moving part connected to the holding part to move the holding part in the z-axis direction and operated in association with the first z-axis moving part.

Each of the fixing tools may further include a y-axis moving part coupled to the first z-axis moving part to move the supporting part in a y-axis direction, and an x-axis moving part coupled to the y-axis moving part to move the supporting part in an x-axis direction.

The base substrate may include openings therethrough, the fixing tools extending through the openings to be movable in the x-axis and y-axis directions in the openings.

The testing apparatus may further include at least one conductor in contact with the display apparatus, and a moving member to move the at least one conductor to a test position, wherein the controller receives or monitors a signal generated by a touch operation to test a touch operation of the display apparatus.

The controller may set a position to test the touch operation according to a bending shape of the display apparatus, and controls the moving member to move the conductor to the set position.

The base substrate may include a virtual coordinate defined therein and used to test the touch operation.

Each of the fixing tools may include a clamper to clamp the display apparatus, and a z-axis moving part slide-coupled to the clamper to move the clamper in the z-axis direction.

The clamper may include an insertion recess, an edge of the display apparatus being inserted into the insertion recess.

Each of the fixing tools may further include a y-axis moving part coupled to the z-axis moving part to move the clamper in a y-axis direction, and an x-axis moving part coupled to the y-axis moving part to move the clamper in an x-axis direction.

Embodiments also provide a method of testing a display apparatus, including disposing the display apparatus on a base substrate, fixing the display apparatus to the base substrate via a plurality of fixing tools, and moving the fixing tools in a z-axis direction independently of each other, the z-axis direction extending along a normal direction to the base substrate, such that the display apparatus is bent in two or more test patterns different from each other, to test flexibility of the display apparatus.

The method may further include, before fixing of the display apparatus, moving the fixing tools in an x-axis direction and a y-axis direction, which are substantially parallel to the base substrate, to control a distance in the x-axis and y-axis directions between the fixing tools.

The method may further include touching the display apparatus using a conductor, and receiving a signal generated by the touch operation to test the touch operation of the display apparatus.

The method may further include setting a position to test the touch operation according to a bending shape of the display apparatus, and controlling a moving member to move the conductor to the set position.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
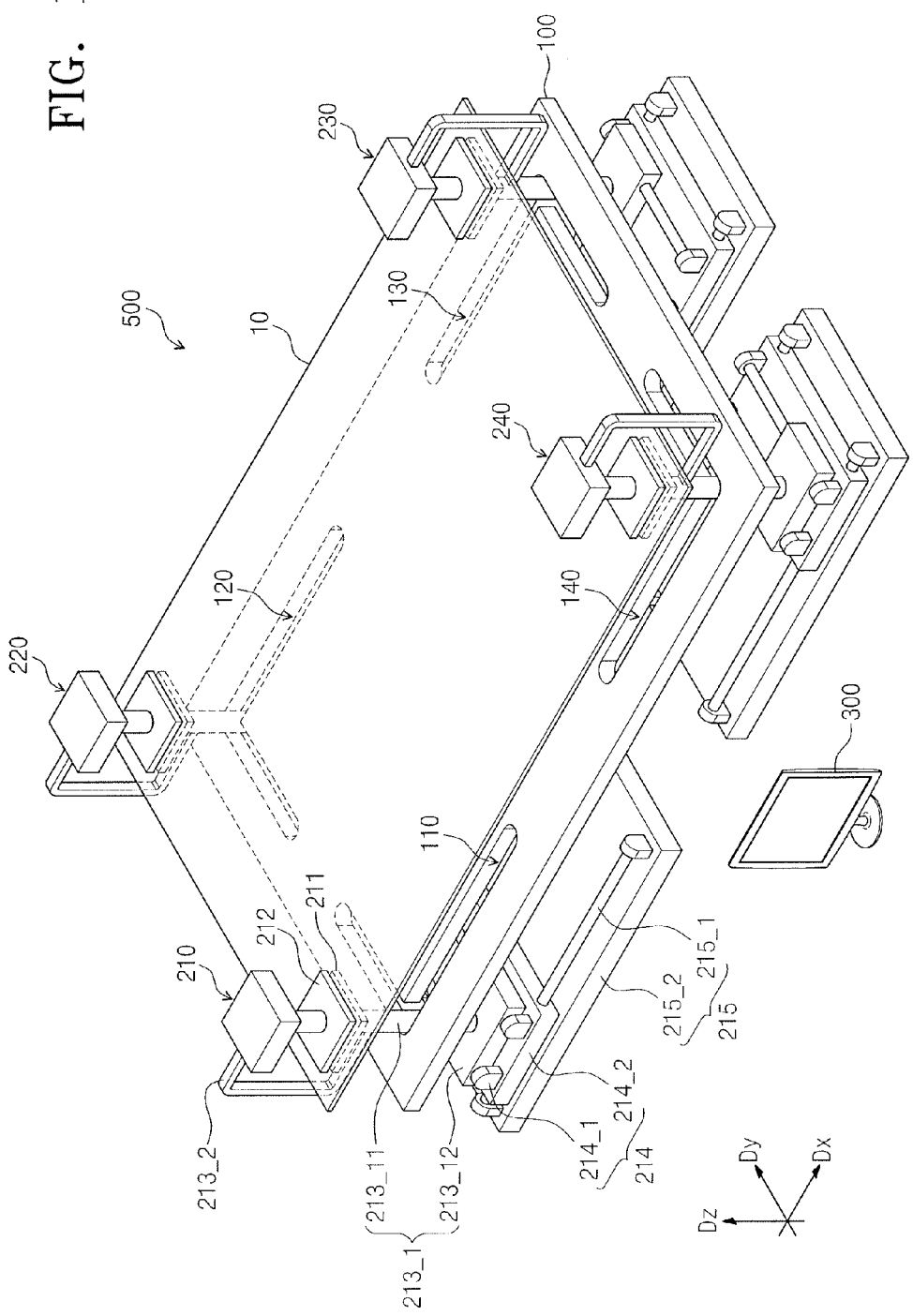
FIG. 1 illustrates a perspective view of a testing apparatus of a display apparatus according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on," "connected to," or "coupled to" another layer or element, it can be directly on the other layer or element, or intervening elements may also be present. In addition, it will also be understood that when an element is referred to as being "between" two elements, it can be the only element between the two elements, or one or more intervening elements may also be present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1 illustrates a perspective view of a testing apparatus 500 of a display apparatus according to an exemplary embodiment of the present disclosure.

Referring to FIG. 1, the testing apparatus 500 allows a display apparatus 10 to be bent in various shapes to test flexibility of the display apparatus 10. Even when the display apparatus 10 is flexible, the display apparatus 10 may be damaged or cracked due to the bending thereof while being used by a user. Accordingly, the display apparatus 10 is required to secure reliability, i.e., flexibility reliability, so that defects caused by the bending of the display apparatus 10 are prevented from occurring. The display apparatus 10 may be tested by the testing apparatus 500 to check whether cracks occur or not in the display apparatus 10, i.e., cracks caused by the bending of the display apparatus 10, or whether the display apparatus 10 partially malfunctions.

The testing apparatus 10 includes a base substrate 100, a plurality of fixing tools 210, 220, 230, and 240, and a controller 300. As an example, the base substrate 100 may have a quadrangular plate shape.

The fixing tools 210, 220, 230, and 240 are disposed above the base substrate 100 to fix the display apparatus 10, and may be operated independently of each other along a z-axis direction Dz with respect to an upper surface of the base substrate 100. The controller 300 controls the operation of the fixing tools 210, 220, 230, and 240 to bend the display apparatus 10 in two or more test patterns. As an example, the fixing tools 210, 220, 230, and 240 are configured to include first, second, third, and fourth fixing tools 210, 220, 230, and 240, and the first, second, third, and fourth fixing tools 210, 220, 230, and 240 hold four corners of the display apparatus 10, respectively. In the present exemplary embodiment, since the first, second, third, and fourth fixing tools 210, 220, 230, and 240 have substantially the same structure and function, only the first fixing tool 210 will be described in detail as a representative example.

The first fixing tool 210 includes a supporting part 211, a holding part 212, and a z-axis moving part 213. The supporting part 211 has a quadrangular plate shape to support a first corner 11 (FIG. 3) among the four corners of the display apparatus 10. The holding part 212 is disposed to face, e.g., completely overlap, the supporting part 211 such that the first corner 11 of the display apparatus 10 is disposed between the supporting part 211 and the holding part 212. The holding part 212 fixes the display apparatus 10 to the supporting part 211. The holding part 212 has a quadrangular plate shape and is disposed substantially in parallel to the supporting part 211 to face the supporting part 211. The z-axis moving part 213 includes a first z-axis moving part 213_1 coupled to the supporting part 211 to move the supporting part 211 in the z-axis direction Dz, and a second z-axis moving part 213_2 coupled to the holding part 212 to move the holding part 212 in the z-axis direction Dz.

The supporting part 211 makes contact with or is disposed adjacent to the upper surface of the base substrate 100 before the display apparatus 10 is loaded on the testing apparatus 500. The holding part 212 is disposed at a position spaced apart from the supporting part 211 by a predetermined distance, in a manner not to interfere with the display apparatus 10, which will be mounted on the supporting part 211. Then, when the display apparatus 10 is loaded, the display apparatus 10 is disposed on the supporting part 211. When the display apparatus 10 is disposed on the supporting part 211, the second z-axis moving part 213_2 makes the holding part 212 move and the holding part 212 is coupled to the supporting part 211 to clamp the display apparatus 10.

When the display apparatus 10 is clamped by the supporting part 211 and the holding part 212, the first z-axis moving part 213_1 makes the supporting part 211 and the holding part 212 move in the z-axis direction Dz in cooperation with the second z-axis moving part 2132. That is, the first and second z-axis moving parts 213_1 and 213_2 make the supporting part 211 and the holding part 212 move to place the display apparatus 10 at an initial testing position spaced apart from the base substrate 100 by a predetermined distance.

The first z-axis moving part 213_1 includes a shaft 213_11 coupled to the supporting part 211 and movable in the z-axis direction Dz, and a shaft controller 213_12 to control the movement of the shaft 213_11. The shaft controller 213_12 makes the shaft 213_11 move in the z-axis direction Dz to control a distance between the supporting part 211 and the base substrate 100.

The testing apparatus 500 further includes a y-axis moving part 214 and an x-axis moving part 215 to move the first z-axis moving part 213_1 in a y-axis direction Dy and an x-axis direction Dx, respectively. The y-axis moving part 214 is coupled to the first z-axis moving part 213_1 and moves the supporting part 211 and the holding part 212 in the y-axis direction Dy. The x-axis moving part 215 is coupled to the y-axis moving part 214 and moves the supporting part 211 and the holding part 212 in the x-axis direction Dx.

The y-axis moving part 214 includes a y-axis rail 214_1 that is slide coupled to the shaft controller 213_12 to allow the first z-axis moving part 213_1 to be movable in the y-axis direction Dy, and a y-axis controller 214_2 making the first z-axis moving part 213_1 move along the y-axis rail 214_1 to control a y-axis position of the first z-axis moving part 213_1. In other words, the y-axis rail 214_1, e.g., two rails, is positioned on the y-axis controller 214_2, and extends in the y-axis direction Dy, so the first z-axis moving part 213_1 may move along the y-axis rail 214_1 in the y-axis direction Dy.

The x-axis moving part 215 includes an x-axis rail 215_1 that is slide coupled to the y-axis controller 214_2 to allow the first z-axis moving part 213_1 to be movable in the x-axis direction Dx, and a x-axis controller 215_2 making the first z-axis moving part 213_1 move along the x-axis rail 215_1 to control an x-axis position of the first z-axis moving part 213_1. In other words, the x-axis rail 215_1, e.g., two rails, is positioned on the x-axis controller 215_2, and extends in the x-axis direction Dx, so the y-axis moving part 214 with the first z-axis moving part 213_1 may move along the x-axis rail 215_1 in the x-axis direction Dx.

However, the y-axis and x-axis moving parts 214 and 215 are not be limited to those shown in FIG. 1. For example, the y-axis and x-axis moving parts 214 and 215 may have various structures as long as the y-axis and x-axis moving parts 214 and 215 make the first z-axis moving part 213_1 move in the y-axis and x-axis directions Dy and Dx.

The base substrate 100 may include a structure that allows the first to fourth fixing tools 210 to 240 to move in the x-axis and y-axis directions Dx and Dy. As an example, the structure may include first, second, third, and fourth sliding holes 110, 120, 130, and 140 each being formed through an edge of the base substrate 100, having a width, through which the shaft 213_11 penetrates, and extending such that the shaft 213_11 slides along the x-axis and y-axis directions Dx and Dy. Each of the first to fourth sliding holes 110 to 140 has an L shape formed by partially cutting away the edge of the base substrate 100.

To bend the display apparatus 10 in two or more test patterns, the controller 300 independently controls the operation of the first to fourth fixing tools 210 to 240. For instance, the controller 300 controls a distance in the x-axis and y-axis directions Dx and Dy between the first to fourth fixing tools 210 to 240 to control the degree or direction of the bending of the display apparatus 10, or the controller 300 controls a height in the z-axis direction Dz of each of the first to fourth fixing tools 210 to 240 to bend or twist a specific portion of the display apparatus 10.

Hereinafter, the testing apparatus performing a testing operation of the display apparatus in various test patterns will be described in detail.

Figure 2:
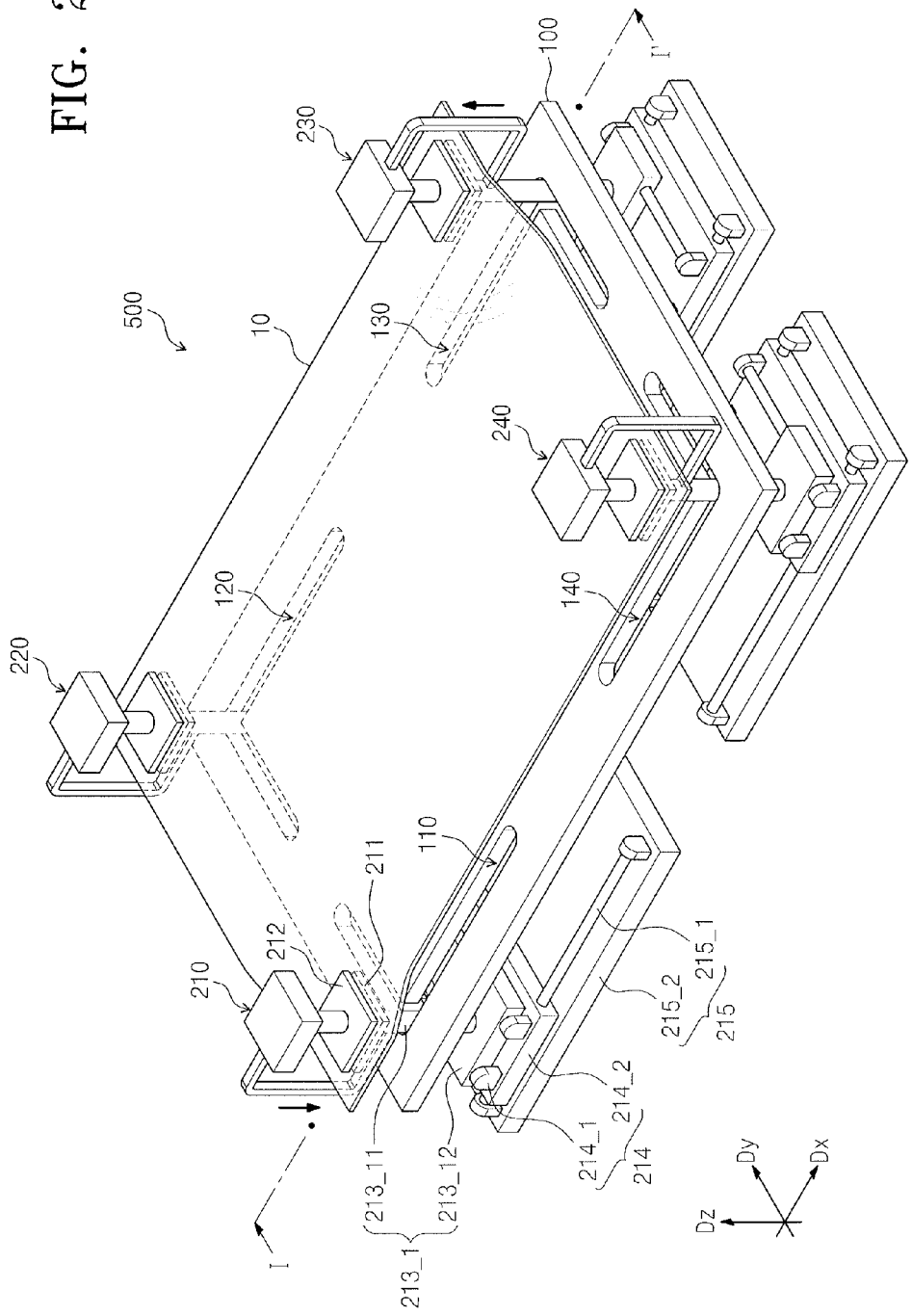
FIG. 2 illustrates a perspective view of a testing apparatus of a display apparatus, which is operated in accordance with a first test pattern.
Figure 3:
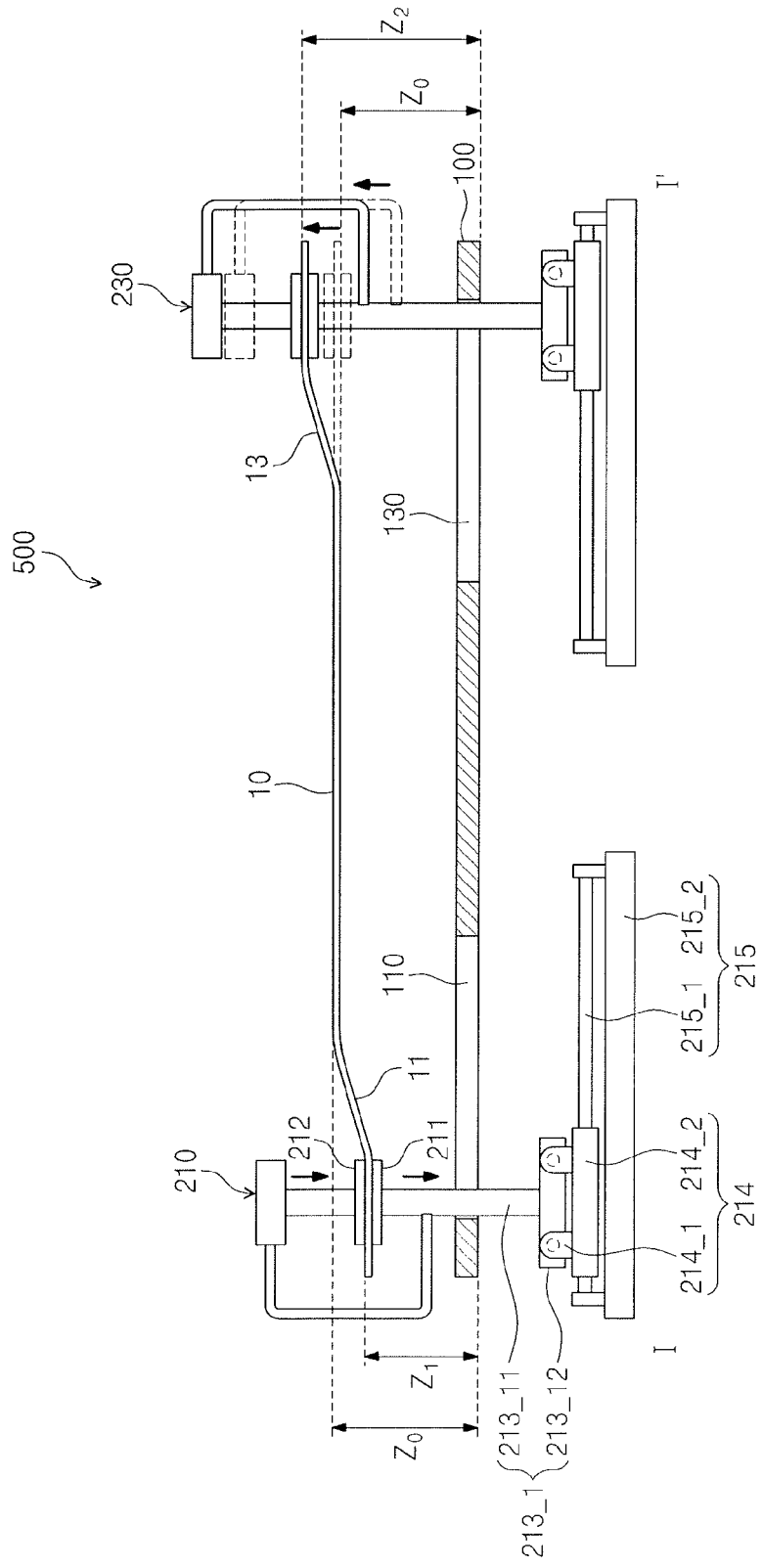
FIG. 3 illustrates a cross-sectional view along line I-I' in FIG. 2.

FIG. 2 illustrates a perspective view of the testing apparatus 500, which is operated in accordance with a first test pattern, and FIG. 3 is a cross-sectional view taken along a line I-I' shown in FIG. 2.

Referring to FIGS. 2 and 3, the first fixing tool 210 falls, e.g., moves, down toward the base substrate 100 with respect to an initial position $Z_0$ and is placed at a first z-axis position $Z_1$, and the third fixing tool 230 rises up in the z-axis direction Dz with respect to the initial position $Z_0$ and is placed at a second z-axis position $Z_2$ to perform the testing operation according to a first test pattern. During the testing operation, distances between the initial position $Z_0$ and each of the first and second z-axis positions $Z_1$ and $Z_2$ may be values that gradually increase or one value previously set by a desired curvature. Meanwhile, during the testing operation according to the first test pattern, the second and fourth fixing tools 220 and 240 may be held at the initial position $Z_0$, e.g., so a center of the display apparatus 10 may be tensioned and maintained at a relative constant height with respect to the base substrate 100 by the second and fourth fixing tools 220 and 240.

As an example, the first and third fixing tools 210 and 230 may be positioned symmetrically with respect to each other, and the second and fourth fixing tools 220 and 240 may be positioned symmetrically with respect to each other. The first to fourth fixing tools 210 to 240 clamp the first to fourth corners of the display apparatus 10, respectively. For example, as illustrated in FIG. 3, the first and third fixing tools 210 and 230 clamp the first and third corners 11 and 13 of the display apparatus 10, respectively In detail, when the first fixing tool 210 falls down to the base substrate 100 with respect to the initial position $Z_0$, the first corner 11 of the display apparatus 10 is bent downward in the z-axis direction Dz by the first fixing tool 210. In addition, when the third fixing tool 230 rises up in the z-axis direction Dz with respect to the initial position $Z_0$, the third corner 13 of the display apparatus 10 is bent upward in the z-axis direction Dz by the third fixing tool 230. Accordingly, the first and third corners 11 and 13 of the display apparatus 10 are bent in opposite directions, respectively, and the shape of the display apparatus 10 is deformed into a twisted shape.

In FIGS. 2 and 3, the first and third fixing tools 210 and 230 move in opposite directions to each other in the z-axis direction Dz, such that the first and third corners 11 and 13 of the display apparatus 10 are bent in opposite directions. However, embodiments are not limited to the described above, e.g., the testing operation may be performed by bending the first and third corners 11 and 13 of the display apparatus 10 in the same direction. In this case, the first and third fixing tools 210 and 230 move in the same direction on the z-axis direction Dz.

When the testing operation of the display apparatus 10 according to the first test pattern is completed, a testing operation according to a second test pattern different from the first test pattern is performed on the display apparatus 10, as will be described in detail with reference to FIG. 4. For the testing operation according to the second test pattern, the first and third fixing tools 210 and 230 return to the initial position $Z_0$.

Figure 4:
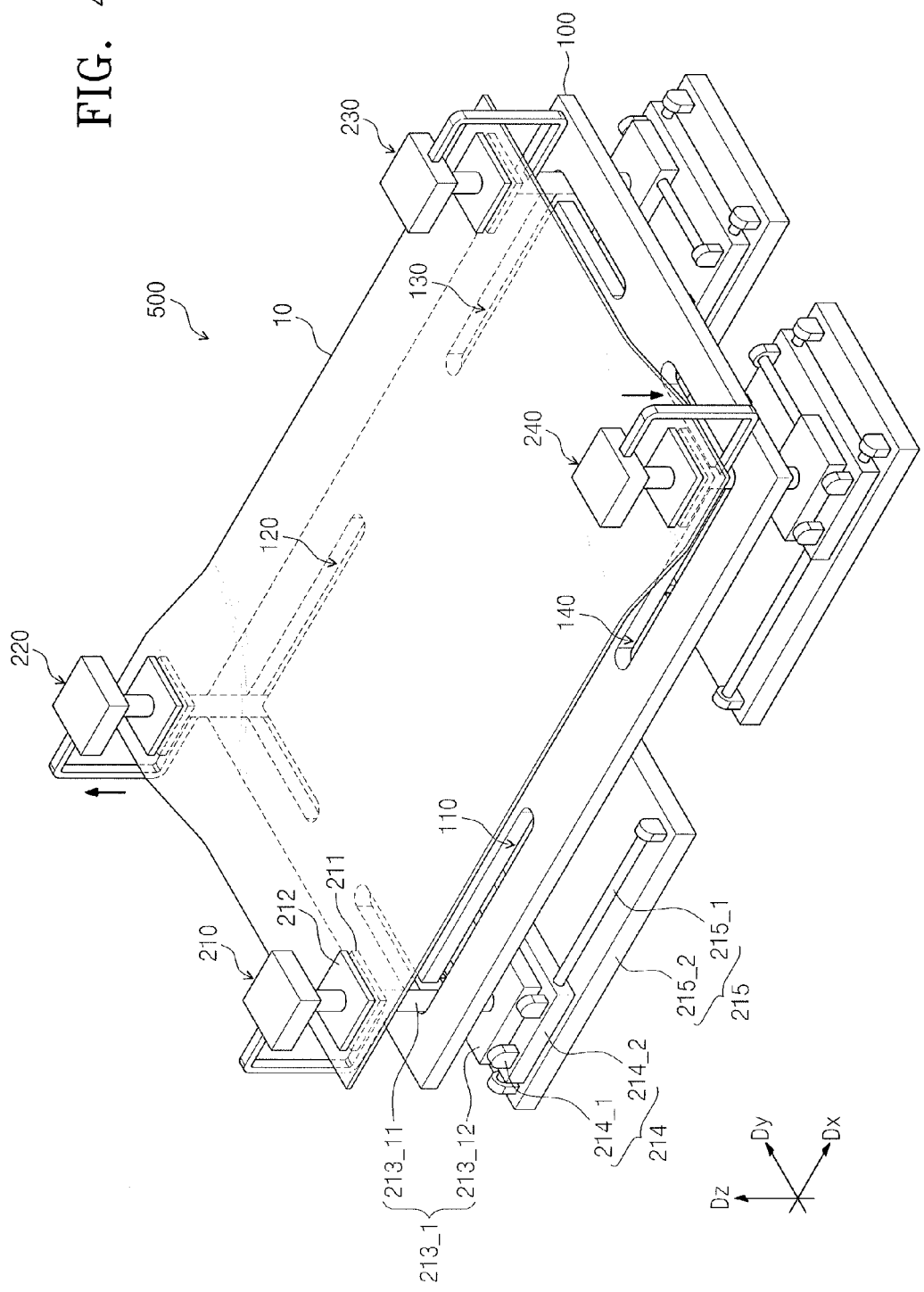
FIG. 4 illustrates a perspective view of a testing apparatus of a display apparatus, which is operated in accordance with a second test pattern.

FIG. 4 illustrates a perspective view showing the testing apparatus 500, which is operated in accordance with a second test pattern.

Referring to FIG. 4, the second fixing tool 220 rises up in the z-axis direction Dz with respect to the initial position $Z_0$ and is placed at the second z-axis position $Z_2$, and the fourth fixing tool 240 falls down to the base substrate 100 with respect to the initial position $Z_0$ and is placed at the first z-axis position $Z_1$ to perform the testing operation according to the second test pattern. During the testing operation, distances between the initial position $Z_0$ and the first and second z-axis positions $Z_1$ and $Z_2$ may be values that gradually increase or one value previously set by a desired curvature. During the testing operation according to the second test pattern, the first and third fixing tools 210 and 230 may be held at the initial position $Z_0$.

When the second fixing tool 220 rises up in the z-axis direction Dz with respect to the initial position $Z_0$, the second corner of the display apparatus 10 is bent upward by the second fixing tool 220. In addition, when the fourth fixing tool 240 falls down toward the base substrate 100 with respect to the initial position $Z_0$, the fourth corner of the display apparatus 10 is bent downward in the z-axis direction Dz by the fourth fixing tool 240. Accordingly, the second and fourth corners of the display apparatus 10 are bent in opposite directions, respectively, and the shape of the display apparatus 10 is deformed into a twisted shape.

In FIG. 4, the second and fourth fixing tools 220 and 240 move in opposite directions to each other in the z-axis direction Dz, such that the second and fourth corners of the display apparatus 10 are bent in opposite directions. However, embodiments are not limited thereto or thereby, e.g., the testing operation may be performed by bending the second and fourth corners of the display apparatus 10 in the same direction. In this case, the second and fourth fixing tools 220 and 240 move in the same direction on the z-axis direction Dz.

When the testing operation of the display apparatus 10 according to the second test pattern is completed, a testing operation according to a third test pattern different from the second test pattern is performed on the display apparatus 10, as will be described in more detail below with reference to FIGS. 5-6. For the testing operation according to the third test pattern, the second and fourth fixing tools 220 and 240 return to the initial position $Z_0$.

Although not shown in FIGS. 2 to 4, reliability of the flexibility of the first to fourth corners of the display apparatus 10 is tested by substantially and simultaneously moving, e.g., up and down, the first to fourth fixing tools 210 to 240 while the display apparatus 10 is supported on the upper surface of the base substrate 10. As such, deformation of the display apparatus in various shapes and direction may be tested to confirm flexibility reliability of the display apparatus.

Figure 5:
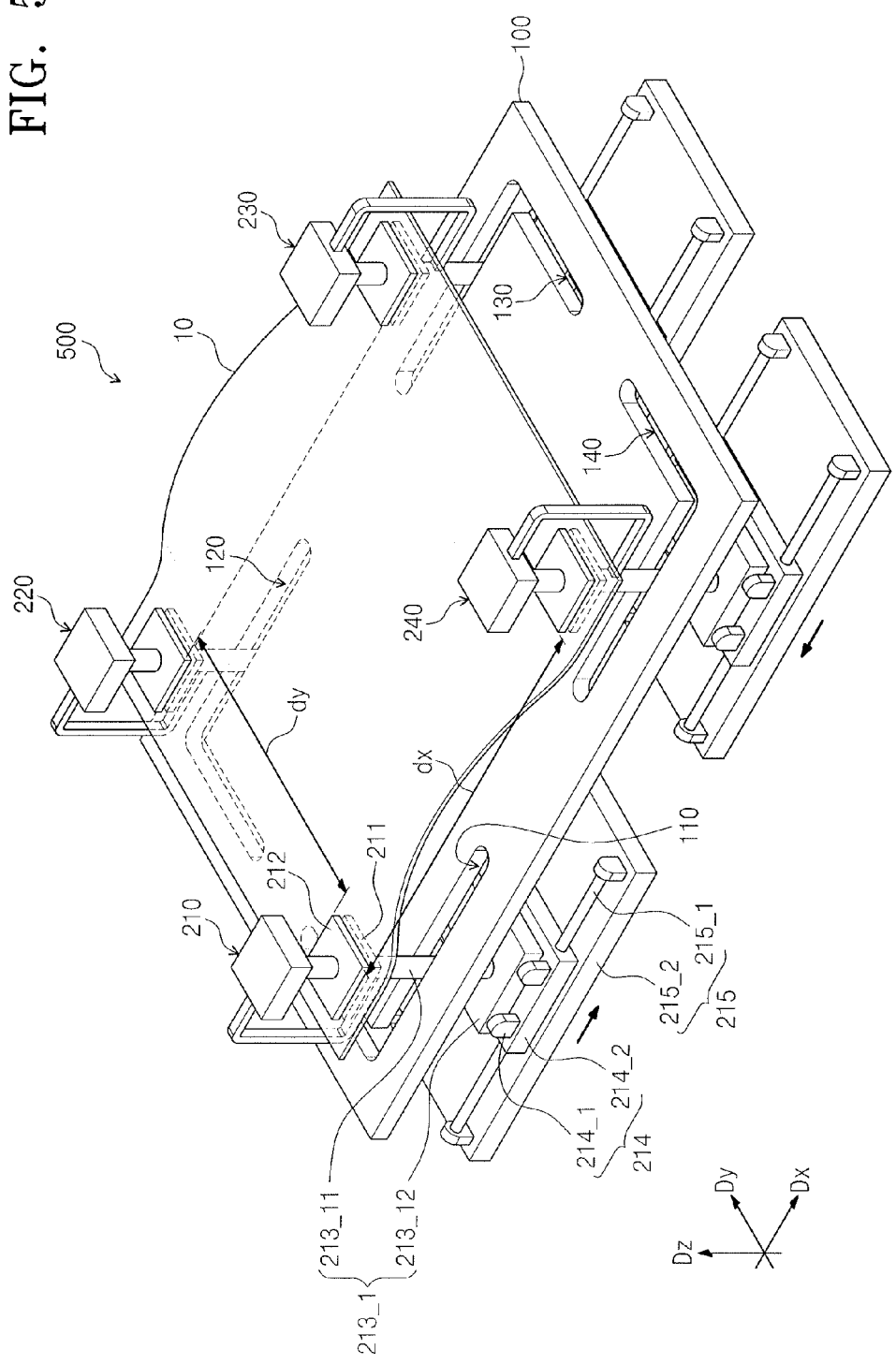
FIG. 5 illustrates a perspective view of a testing apparatus of a display apparatus, which is operated in accordance with a third test pattern.
Figure 6:
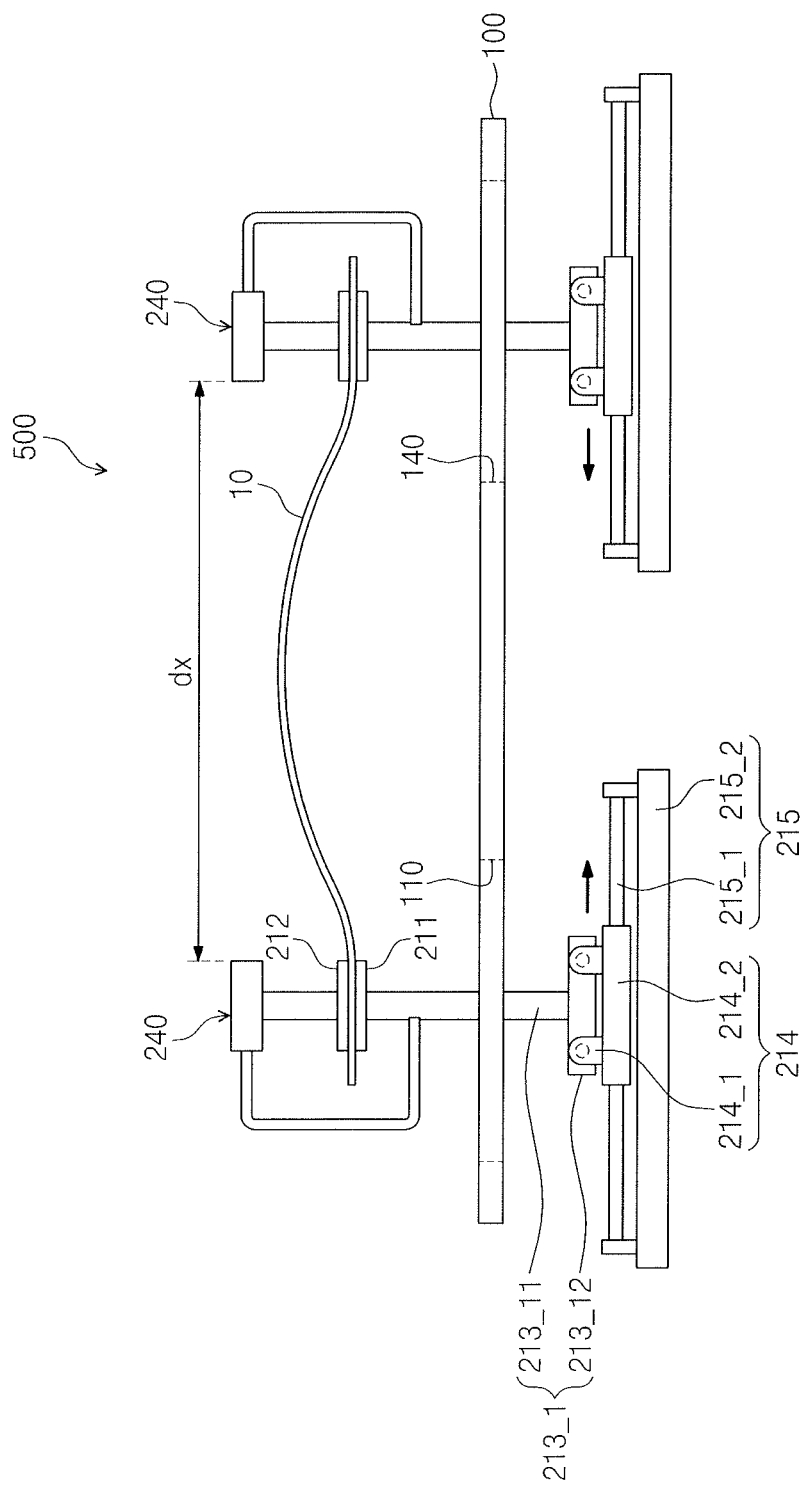
FIG. 6 illustrates a cross-sectional view along line II-II' in FIG. 5.

FIG. 5 illustrates a perspective view of the testing apparatus 500, which is operated in accordance with a third test pattern, and FIG. 6 illustrates a cross-sectional view taken along a line II-II' shown in FIG. 5.

Referring to FIGS. 5 and 6, to perform the testing operation according to the third test pattern, a horizontal position of each of the first to fourth fixing tools 210 to 240 may be controlled to allow the display apparatus 10 to be bent in the z-axis direction Dz. In detail, the first and fourth fixing tools 210 and 240 move toward each other in the x-axis direction Dx to be closer to each other, and the second and third fixing tools 220 and 230 move toward each other in the x-axis direction Dx to be closer to each other. As such, due to the reduced distance dx in the x-axis direction Dx between the first through fourth fixing tools 210 through 240, a center of the display apparatus 10 may be curved and raised in the z-axis direction Dz.

FIGS. 5 and 6 show a method of reducing a distance dx in the x-axis direction Dx between the first and fourth fixing tools 210 and 240 by substantially and simultaneously moving the first and fourth fixing tools 210 and 240 as a representative example. However, the distance dx in the x-axis direction Dx between the first and fourth fixing tools 210 and 240 may be reduced by moving only one fixing tool of the first and fourth fixing tools 210 and 240.

In addition, FIGS. 5 and 6 show a method of reducing a distance dx in the x-axis direction Dx between the second and third fixing tools 220 and 230 by substantially and simultaneously moving the second and third fixing tools 220 and 230 as a representative example. However, the distance dx in the x-axis direction Dx between the second and third fixing tools 220 and 230 may be reduced by moving only one fixing tool of the second and third fixing tools 220 and 230.

Accordingly, the testing operation may be performed on the display apparatus 10 after the display apparatus 10 is generally bent in the z-axis direction Dz with respect to a y-axis center line. Further, although not shown in figures, the testing operation may be performed by allowing, after the distance between the first and fourth fixing tools 210 and 240 is controlled to be different from the distance between the second and third fixing tools 220 and 230, a curvature of the display apparatus 10 to become different according to positions on the y-axis center line.

In addition, when a distance dy in the y-axis direction Dy between the first and second fixing tools 210 and 220 and between the third and fourth fixing tools 230 and 240 is reduced after the first to fourth fixing tools 210 to 240 return to the initial position, the testing operation may be performed by generally bending the display apparatus 10 in the z-axis direction Dz with respect to an x-axis center line. In this case, the testing operation may be performed by allowing, after the distance between the first and second fixing tools 210 and 220 is controlled to be different from the distance between the third and fourth fixing tools 230 and 240, a curvature of the display apparatus 10 to become different according to positions on the x-axis center line.

Figure 7:
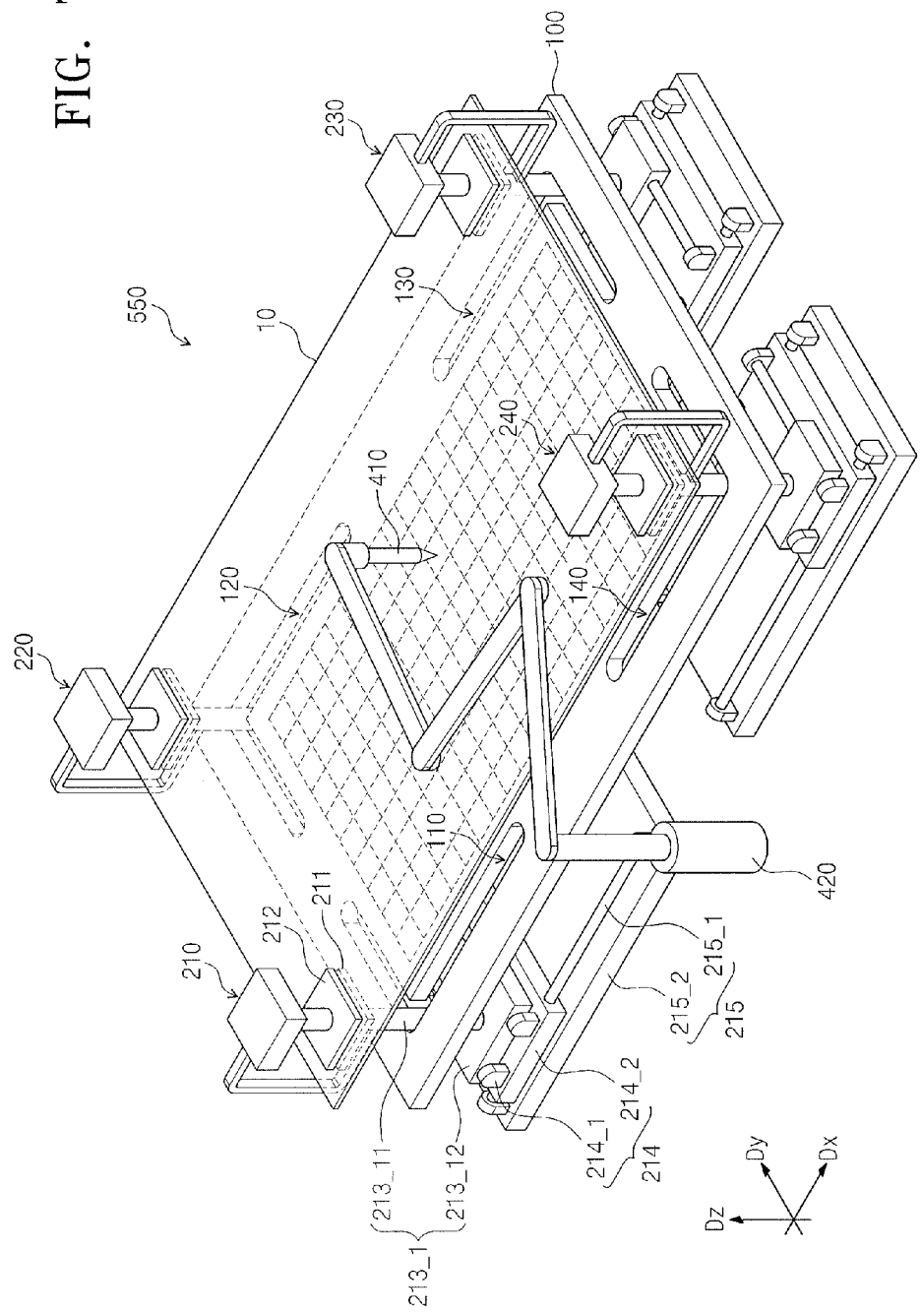
FIG. 7 illustrates a perspective view of a testing apparatus of a display apparatus according to another exemplary embodiment of the present disclosure.
Figure 8:
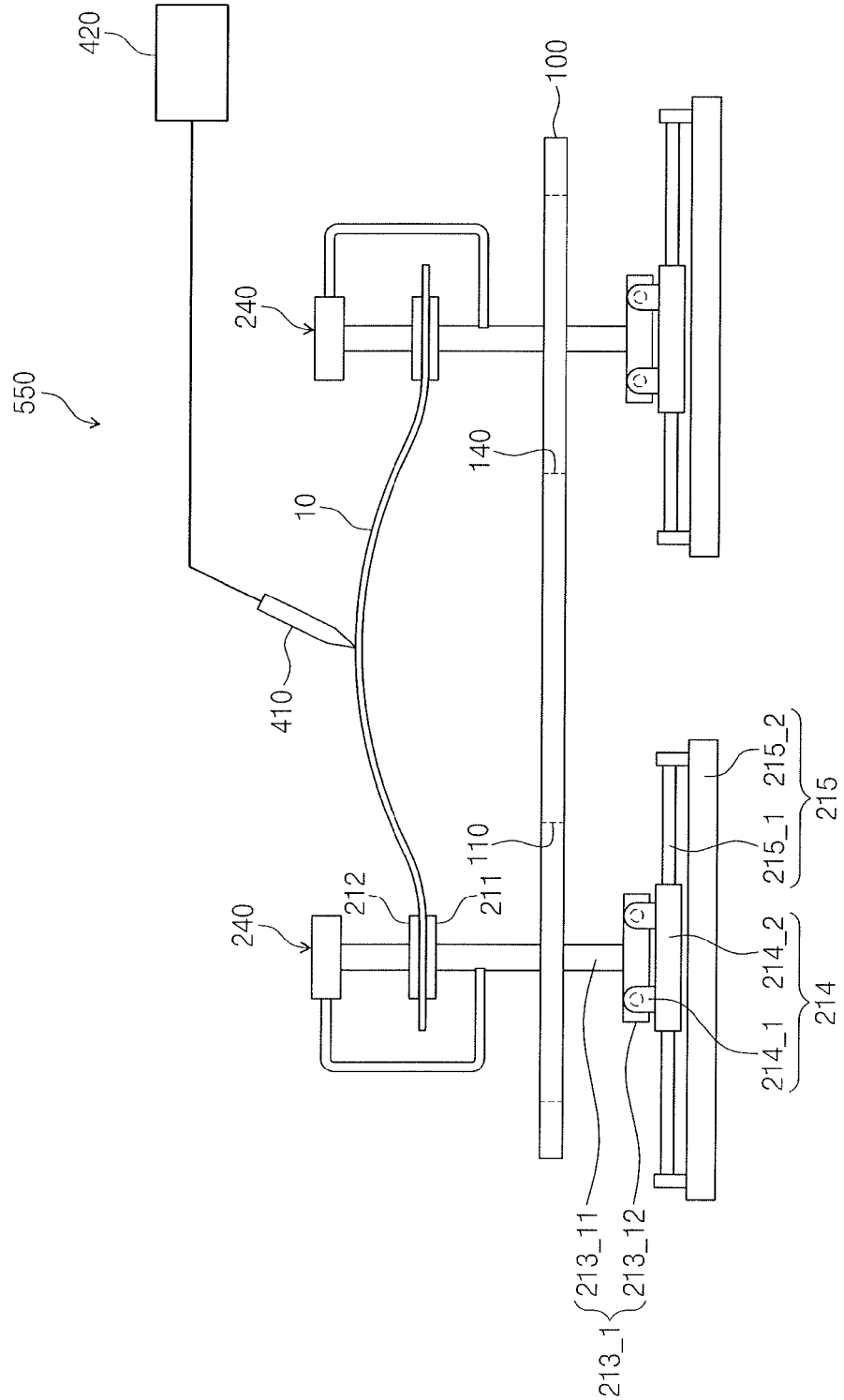
FIG. 8 illustrates a cross-sectional view along line III-III' in FIG. 7.

FIG. 7 illustrates a perspective view of a testing apparatus 550 of a display apparatus according to another exemplary embodiment of the present disclosure, and FIG. 8 illustrates a cross-sectional view taken along a line shown in FIG. 7. In FIGS. 7 and 8, the same reference numerals denote the same elements as in FIGS. 5 and 6, and thus detailed descriptions of the same elements will be omitted.

Referring to FIG. 7, the testing apparatus 550 includes at least one conductor 410 that touches the display apparatus 10, and a moving member 420 coupled to the conductor 410 to move the conductor 410 to a desired position. The controller 300 (refer to FIG. 1) receives a signal generated by a touch operation of the conductor 410 and tests the touch operation of the display apparatus 10.

The base substrate 100 may be provided with a virtual coordinate defined thereon and used to inspect the touch operation. The virtual coordinate is defined by x-axis and y-axis virtual lines respectively connecting virtual dots along the x-axis and y-axis directions Dx and Dy, which are formed in the x-axis and y-axis directions Dx and Dy at regular intervals.

To move the conductor 410 to a predetermined test coordinate set for the testing of the touch operation test, the controller 300 controls the moving member 420. The moving member 420 makes the conductor 410 move to an upper portion of the test coordinate and makes the conductor 410 make contact with the display apparatus 10 at a specific position of the display apparatus 10, which corresponds to the test coordinate, or makes the conductor 410 move to be closer to the specific position. During the testing of the touch operation, the display apparatus 10 is turned on to recognize the touch operation, and thus the display apparatus 10 performs a function corresponding to the touch operation.

The controller 300 monitors a screen of the display apparatus 10 to check whether the display apparatus 10 precisely recognizes the touch operation or not. In addition, when the controller 300 is electrically connected to the display apparatus 10, the controller 300 measures sensitivity of the display apparatus 10 with respect to the touch operation, and compares the measured sensitivity with a predetermined reference sensitivity to check whether a defect occurs on the touch sensitivity of the display apparatus 10.

As shown in FIG. 8, the testing apparatus 550 may perform the testing of the touch operation while the display apparatus 10 is bent. That is, when the testing apparatus 550 deforms the shape of the display apparatus 10 according to the predetermined test pattern in order to test its flexibility, the controller 300 controls the moving member 420 to move the conductor 410 to the bent portion of the display apparatus 10.

In case of an electrostatic capacitive type touch panel applied to a flexible display apparatus, when the display apparatus 10 is bent, an electrostatic capacitance is varied in the bending portion of the display apparatus 10. Due to the variation of the electrostatic capacitance, the display apparatus 10 may not precisely recognize the touch operation even though the touch operation occurs in the bent portion of the display apparatus 10. That is, the testing apparatus 550 may check whether the display apparatus 10 precisely recognizes the touch operation or not even though the display apparatus 10 is bent, and thus the reliability of the display apparatus 10 against the touch operation may be improved.

The testing of the touch operation may be performed in association with the testing operation according to various test patterns, and the positions at which the conductor 410 touches on the display apparatus 10 may be determined depending on the test patterns.

Figure 9:
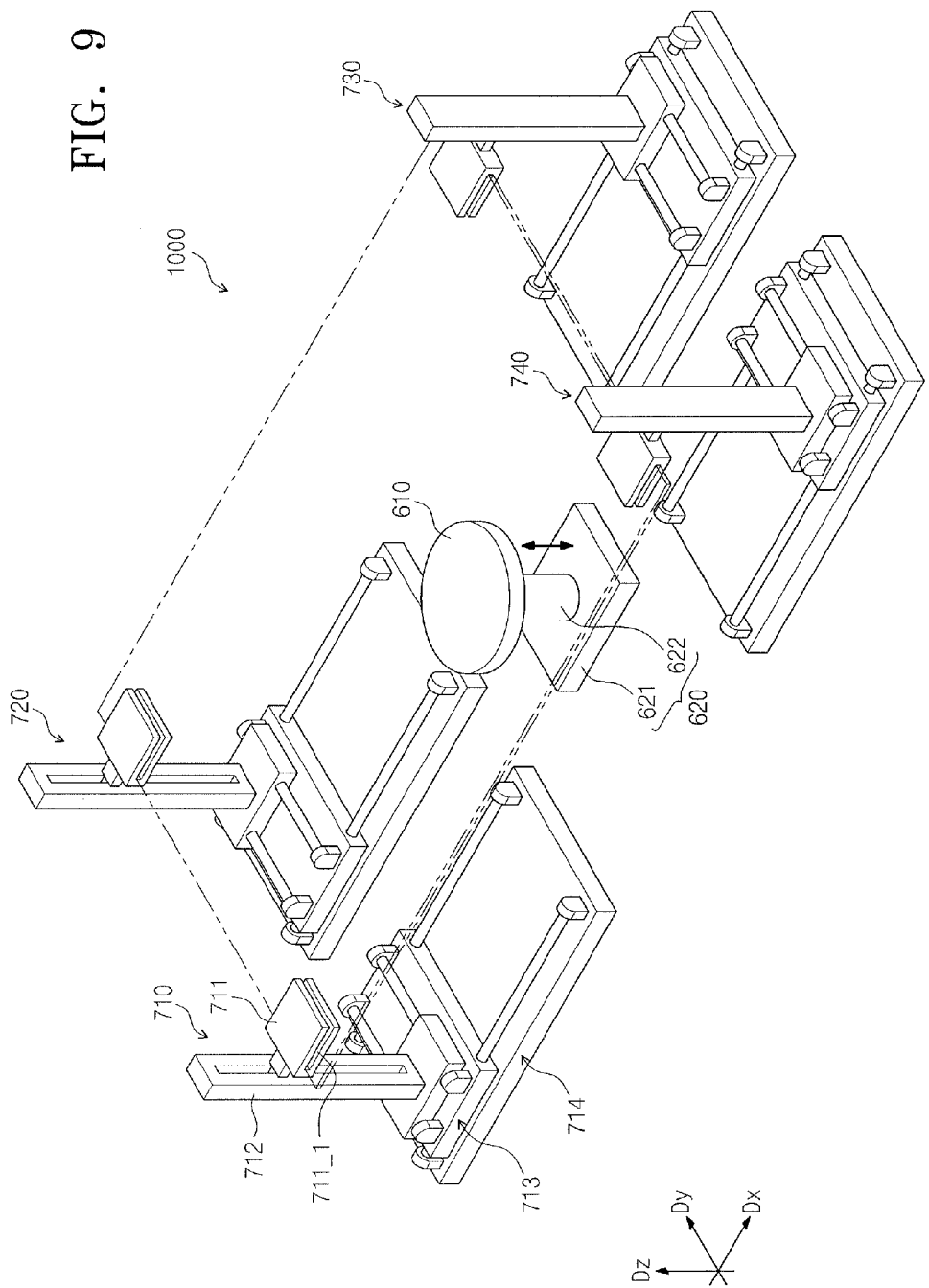
FIG. 9 illustrates a perspective view of a display apparatus according to another exemplary embodiment of the present disclosure.

FIG. 9 illustrates a perspective view showing a display apparatus 1000 according to another exemplary embodiment of the present disclosure. In FIG. 9, the same reference numerals denote the same elements in FIG. 1, and thus detailed descriptions of the same elements will be omitted.

Referring to FIG. 9, the testing apparatus 1000 includes a base substrate 610 to support the display apparatus 10 loaded into the testing apparatus 1000, and a plurality of fixing tools 710, 720, 730, and 740 to hold an edge of the display apparatus 10, which independently make the display apparatus 10 move in the z-axis direction Dz. The testing apparatus 1000 further includes a substrate moving part 620 configured to move the base substrate 610 in the z-axis direction Dz. The substrate moving part 620 includes a shaft 622 coupled to the base substrate 610 to move the base substrate 610 in the z-axis direction Dz, and a shaft controller 621 to control the shaft 622.

The base substrate 610 has a circular shape to support a center portion of the display apparatus 10, and moves in the z-axis direction Dz by the substrate moving part 620 to control a height of the display apparatus 10. Although not shown in figures, the testing apparatus 1000 may further include x-axis and y-axis moving parts to control positions in x- and y-axes of the base substrate 610.

Fixing tools 710, 720, 730, and 740 are configured to include first, second, third, and fourth fixing tools 710, 720, 730, and 740. The first, second, third, and fourth fixing tools 710 to 740 respectively hold four corners of the display apparatus 10. Since the first, second, third, and fourth fixing tools 710, 720, 730, and 740 have the same structure and function, hereinafter, only the first fixing tool 710 among the first to fourth fixing tools 710 to 740 will be described in detail.

The first fixing tool 710 includes a clamper 711 to clamp the edge of the display apparatus 10 and a z-axis moving part 712 to move the clamper 711 in the z-axis direction Dz. The clamper 711 is provided with an insertion recess 711_1 formed by removing a portion of the clamper 711_1, into which the edge of the display apparatus 10 is inserted. The clamper 711 is slide coupled to the z-axis moving part 712. Accordingly, a height of the clamper 711 is controlled by the z-axis moving part 712.

When the display apparatus 10 is loaded into the testing apparatus 1000, the display apparatus 10 is mounted on the base substrate 610 and the four corners of the display apparatus 10 are clamped by the clampers 711 of the first to fourth fixing tools 710 to 740. The z-axis moving part 712 controls the height of the clamper 711 such that the display apparatus 10 is placed at an initial testing position.

As shown in FIG. 9, the testing apparatus 1000 further includes a y-axis moving part 713 to move the z-axis moving part 712 in the y-axis direction Dy, and an x-axis moving part 714 to move the z-axis moving part 712 in the x-axis direction Dx. The y-axis and x-axis moving parts 713 and 714 have the same structure and function as those of the y-axis and x-axis moving parts 214 and 215, respectively, and thus detailed descriptions of the y-axis and x-axis moving parts 713 and 714 will be omitted in order to avoid redundancy.

Then, when the testing operation starts, the height of the clamper 711 of each of the first to fourth fixing tools 710 to 740, and the distance between the first to fourth fixing tools 710 to 740 are controlled in accordance with the test pattern to deform the shape of the display apparatus 10. The first to fourth fixing tools 710 to 740 are not be limited to the shapes shown in FIGS. 1 to 9 as long as the first to fourth fixing tools 710 to 740 hold the corners of the display apparatus 10, while independently moving in the z-axis direction Dz.

As described above, when the testing operation is performed on the display apparatus 10, after the display apparatus 10 is bent in various shapes, the reliability of the display apparatus 10 may be improved with respect to various bending shapes. In addition, since testing of a touch operation may be performed on the display apparatus 10, even when the display apparatus 10 is bent, reliability of the touch operation of the flexible display apparatus may be improved.

By way of summation and review, an apparatus for testing flexibility of a flexible display apparatus by deformation in various shapes does not exist. Therefore, according to example embodiments, a testing apparatus includes fixing tools independently movable in the z-axis direction, so a testing operation may be performed on a display apparatus by independently moving the fixing tools to deform the display apparatus in various shapes to test the flexibility of the display apparatus. In addition, as a touch operation may be tested when the display apparatus is bent, reliability of the touch operation test of the display apparatus may be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A testing apparatus for testing a display apparatus, the testing apparatus comprising:
   a base substrate;
   a plurality of fixing tools on the base substrate to affix the display apparatus to the base substrate, the plurality of fixing tools being movable in a z-axis direction independently of each other, the z-axis direction extending along a normal direction to the base substrate; and
   a controller to control the fixing tools to bend the display apparatus in two or more test patterns different from each other,
   wherein each of the plurality of fixing tools is movable in the z-axis direction, in a y-axis direction, and in an x-axis direction.

2. The testing apparatus as claimed in claim 1, wherein the fixing tools include first, second, third, and fourth fixing tools, the first, second, third, and fourth fixing tools clamping first, second, third, and fourth corners of the display apparatus, respectively.

3. The testing apparatus as claimed in claim 2, wherein the first, second, third, and fourth fixing tools are independently moveable in an x-axis direction and a y-axis direction, the x-axis direction and the y-axis direction being parallel to the base substrate.

4. The testing apparatus as claimed in claim 3, wherein a distance in the x-axis and y-axis directions between the first, second, third, and fourth fixing tools is controlled according to a size of the display apparatus.

5. The testing apparatus as claimed in claim 1, wherein each of the fixing tools includes:
   a supporting part to support the display apparatus;
   a holding part facing the supporting part, such that the display apparatus is between the holding part and the supporting part, the holding part fixing the display apparatus to the supporting part;
   a first z-axis moving part connected to the supporting part to move the supporting part in the z-axis direction; and
   a second z-axis moving part connected to the holding part to move the holding part in the z-axis direction and operated in association with the first z-axis moving part.

6. The testing apparatus as claimed in claim 5, wherein each of the fixing tools further comprises:
   a y-axis moving part coupled to the first z-axis moving part to move the supporting part in a y-axis direction; and
   an x-axis moving part coupled to the y-axis moving part to move the supporting part in an x-axis direction.

7. The testing apparatus as claimed in claim 6, wherein the base substrate includes openings therethrough, the fixing tools extending through the openings to be movable in the x-axis and y-axis directions in the openings.

8. The testing apparatus as claimed in claim 1, further comprising:
   at least one conductor in contact with the display apparatus; and
   a moving member to move the at least one conductor to a test position,
   wherein the controller receives or monitors a signal generated by a touch operation to test the touch operation of the display apparatus.

9. The testing apparatus as claimed in claim 8, wherein the controller sets a position to test the touch operation according to a bending shape of the display apparatus, and controls the moving member to move the conductor to the set position.

10. The testing apparatus as claimed in claim 8, wherein the base substrate includes a virtual coordinate defined therein and used to test the touch operation.

11. The testing apparatus as claimed in claim 1, wherein each of the fixing tools includes:
    a clamper to clamp the display apparatus; and
    a z-axis moving part slide-coupled to the clamper to move the clamper in the z-axis direction.

12. The testing apparatus as claimed in claim 11, wherein the clamper includes an insertion recess, an edge of the display apparatus being inserted into the insertion recess.

13. The testing apparatus as claimed in claim 11, wherein each of the fixing tools further comprises:
    a y-axis moving part coupled to the z-axis moving part to move the clamper in a y-axis direction; and
    an x-axis moving part coupled to the y-axis moving part to move the clamper in an x-axis direction.

14. The testing apparatus as claimed in claim 1, wherein the plurality of fixing tools are movable in the z-axis direction independently of each other to different heights from each other.

15. The testing apparatus as claimed in claim 1, wherein the plurality of fixing tools extend through the base substrate to contact the display apparatus, each of the plurality of fixing tools contacting two opposite surfaces of the display apparatus to hold the display apparatus.

16. A method of testing a display apparatus, the method comprising:
   disposing the display apparatus on a base substrate;
   fixing the display apparatus to the base substrate via a plurality of fixing tools; and
   moving the fixing tools in a z-axis direction independently of each other, the z-axis direction extending along a normal direction to the base substrate, such that the display apparatus is bent in two or more test patterns different from each other, to test flexibility of the display apparatus,
   wherein each of the plurality of fixing tools is movable in the z-axis direction, in a y-axis direction, and in an x-axis direction.

17. The method as claimed in claim 16, further comprising, before fixing of the display apparatus, moving the fixing tools in an x-axis direction and a y-axis direction, which are substantially parallel to the base substrate, to control a distance in the x-axis and y-axis directions between the fixing tools.

18. The method as claimed in claim 16, further comprising:
   touching the display apparatus using a conductor; and
   receiving a signal generated by a touch operation to test the touch operation of the display apparatus.

19. The method as claimed in claim 18, further comprising:
   setting a position to test the touch operation according to a bending shape of the display apparatus; and
   controlling a moving member to move the conductor to the set position.

* * * * *